United States Patent
Medina (10) Patent No.: US 10,181,858 B1
(45) Date of Patent: Jan. 15, 2019

(54) AUTO-ZERO ALGORITHM FOR REDUCING MEASUREMENT NOISE IN ANALOG-TO-DIGITAL SYSTEMS OVER A WIDE RANGE OF SAMPLING RATES

(71) Applicant: NATIONAL INSTRUMENTS CORPORATION, Austin, TX (US)

(72) Inventor: Raymundo J. Medina, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

(21) Appl. No.: 15/827,824

(22) Filed: Nov. 30, 2017

(51) Int. Cl.
| | |
|---|---|
| H03M 1/06 | (2006.01) |
| H03M 3/00 | (2006.01) |
| H03M 1/18 | (2006.01) |
| H03M 1/12 | (2006.01) |

(52) U.S. Cl.
CPC ....... H03M 1/0626 (2013.01); H03M 1/1255 (2013.01); H03M 1/18 (2013.01); H03M 3/384 (2013.01)

(58) Field of Classification Search
CPC .... H03M 1/0626; H03M 1/1255; H03M 1/18; H03M 3/384
USPC .................................. 341/118–155; 375/346
See application file for complete search history.

(56) References Cited

U.S. PATENT DOCUMENTS

| | | | |
|---|---|---|---|
| 4,748,418 A | 5/1988 | Kerth | |
| 5,053,770 A | 10/1991 | Mayer | |
| 6,026,127 A | 2/2000 | Lewicki | |
| 6,243,034 B1 * | 6/2001 | Regier | H03M 1/145 341/155 |
| 6,371,417 B1 * | 4/2002 | Southon | B61L 1/165 246/247 |
| 6,956,779 B2 | 10/2005 | Tran | |
| 7,031,214 B2 | 4/2006 | Tran | |
| 8,601,962 B2 * | 12/2013 | Kowalchuk | A01C 7/126 111/178 |
| 8,766,649 B1 * | 7/2014 | Lumbab | G01B 7/023 324/654 |
| 2006/0197574 A1 | 9/2006 | Naviasky | |
| 2012/0105054 A1 * | 5/2012 | Connolly | G01P 15/123 324/162 |
| 2012/0269305 A1 * | 10/2012 | Hogeboom | H04L 7/033 375/346 |

(Continued)

*Primary Examiner* — Lam T Mai
(74) *Attorney, Agent, or Firm* — Meyertons Hood Kivlin Kowert & Goetzel, P.C.; Jeffrey C. Hood (57) ABSTRACT

Sampling accuracy during sampling of analog input signals may be improved by performing an "auto-zero every sample" procedure. The ratio of input signal samples to zero input samples for the sampling time interval defined by the sampling frequency may be determined based on the sampling frequency. For sampling frequencies equal to or less than a specified frequency characteristic of the signal conditioning path of the analog input signal, the ratio may be set to unity (one). For sampling frequencies above the specified frequency, the ratio may be set to be greater than unity (one), and may be a power-of-two. A digital signal processing block may include independent digital signal processing paths for the input signal measurements and the zero input measurements. Each signal processing path may include a low-pass infinite impulse response filter, an average decimation finite impulse response filter, and a binary shifter to allow for the adjustable ratio.

20 Claims, 9 Drawing Sheets

(56) References Cited

U.S. PATENT DOCUMENTS

| | | |
|---|---|---|
| 2013/0127526 A1 | 5/2013 | Sayuk |
| 2014/0232916 A1* | 8/2014 | Nagai ................. H03M 1/56 |
| | | 348/302 |
| 2015/0270805 A1 | 9/2015 | Maurino |
| 2017/0288691 A1* | 10/2017 | Nagai ................. H03M 1/56 |
| 2018/0091752 A1* | 3/2018 | Ebihara ............. H03K 5/2481 |

* cited by examiner

AUTO-ZERO ALGORITHM FOR REDUCING MEASUREMENT NOISE IN ANALOG-TO-DIGITAL SYSTEMS OVER A WIDE RANGE OF SAMPLING RATES

BACKGROUND OF THE INVENTION

Field of the Invention

This invention relates generally to measurement and data acquisition systems and, more particularly, to an auto-zero algorithm for reducing measurement noise in analog-to-digital systems over a wide range of sampling rates.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include a Source-Measure Unit (SMU), which may apply a voltage to a DUT and measure the resulting current, or may apply a current to the DUT and measure the resulting voltage.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT or to influence the system being controlled.

Many present day DAQ systems employ a process referred to as "auto-zeroing", which helps correct for offset errors that may be present in the analog input signal path, and also helps improve low-frequency noise measurement performance. Conventional auto-zeroing algorithms are executed to measure the offset of a signal conditioning path via an internal short (zero volts standard), and use this measurement to correct for the offset error during subsequent measurements. Auto-zeroing algorithms are often executed as "auto-zero once" (AZO) and/or "auto-zero every sample" (AZES). During AZO, the offset is measured at the beginning of signal/data/sample acquisition. AZO is an effective offset cancellation technique, so long as ambient temperature is stable throughout the acquisition. This type of auto-zeroing has no impact on low-frequency noise measurement performance. During AZES, the offset is measured at the beginning of every sample period, making it an effective offset cancellation technique in the presence of ambient temperature fluctuations. This type of auto-zeroing improves low-frequency noise measurement performance. However, overall, the performing or executing of AZES algorithm incurs a noise penalty. For low-frequency sample measurements, or low sample frequency measurements, the benefits of removing low frequency noise outweigh the noise penalty of AZES. However, this is not the case for sampling-frequencies well above the flicker noise corner frequency. Therefore, there is a need for improvements in auto-zeroing techniques.

Other corresponding issues related to the prior art will become apparent to one skilled in the art after comparing such prior art with the present invention as described herein.

SUMMARY OF THE INVENTION

In some embodiments, an instrument, e.g. an instrument in an automated test system, may have the ability to perform auto-zeroing that reduces measurement time and measurement noise when performing an "auto-zeroing once" (AZO) procedure, while also reducing measurement noise when performing an "auto-zeroing every sample" (AZES) procedure over a wide range of sample rates. In some embodiments the instrument may be a data acquisition (DAQ) device, which may be a hardware and/or hardware/software combination device for acquiring sample data and/or generating control signals, and/or for performing various operations associated data acquisition, testing, and/or control. However, various other embodiments may feature systems that include other instruments, e.g. measurement instruments or signal generators or a variety of other similar equipment, which may equally benefit from the auto-zeroing techniques disclosed herein. The instruments may include multiple components that may themselves be individually characterized as instruments. For example, the instrument may be an oscilloscope, a source measure unit, a digitizer, a vector analyzer, a digitizer, etc.

In some embodiments, a system, e.g. a DAQ system may include a sampling circuit and a digital signal processing circuit. The sampling circuit may obtain first samples representative of a reference signal, which may be a zero signal, by sampling the reference signal according to a sampling rate during a first time period of each sampling time interval defined by the sampling rate. The sampling circuit may also obtain second samples representative of an input signal, e.g. any analog input signal, by sampling the input signal according to the sampling rate during a second time period of each sampling time interval. The ratio of the second time period to the first time period, (also viewed as the ratio of the number of input signal samples to the number of zero signal samples, or input-to-zero ratio for short) may be determined based on the sampling rate, thereby reducing measurement noise over a wide range of sampling rates.

The digital signal processing circuit may then process the first samples to obtain an offset value, and process the second samples to obtain an input signal value. The digital signal processing circuit may then adjust the input signal value based on the offset value. In some embodiments, the digital signal processing circuit includes a first digital signal processing path for processing the first samples, and further includes a second digital signal processing path distinct from the first digital signal processing path for processing the second samples. The first digital signal processing path and the second digital signal processing path may each include a low-pass filter for receiving and filtering samples, an average decimation filter for averaging the filtered samples to produce an average sample value, and a binary shifter for adjusting the average sample value according to the ratio of the second time period to the first time period. The use of the low-pass filter and binary shifter make it possible to have a non-unitary input-to-zero ratio.

The system may also include a signal conditioning path for conditioning the reference signal and the input signal prior to the reference signal and the input signal being sampled. The ratio of the second time period to the first time period (the input-to-zero ratio) may be set to one (1), when the sampling frequency is equal to or lower than a specified frequency characteristic of (or associated with) the signal conditioning path (e.g. the flicker noise frequency of the signal conditioning path), and it may be set to value greater than one, e.g. set to a power-of-two greater than one, when the sampling frequency is greater than the specified frequency characteristic of the signal conditioning path. The input-to-zero ratio may be set to different values corresponding to various different sampling frequency values or corresponding to different ranges of sampling frequency values when the sampling frequency value exceeds the specified frequency.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the various embodiments of system(s) and/or procedure(s)/method(s) used to perform auto-zeroing techniques disclosed herein may be used in any of various types of systems. Thus, the system(s) and method(s) pertaining to auto-zeroing disclosed herein may be used in any of various types of applications, including the control of other types of devices such as multimedia devices, video devices, audio devices, telephony devices, Internet devices, etc.

Figure 1:
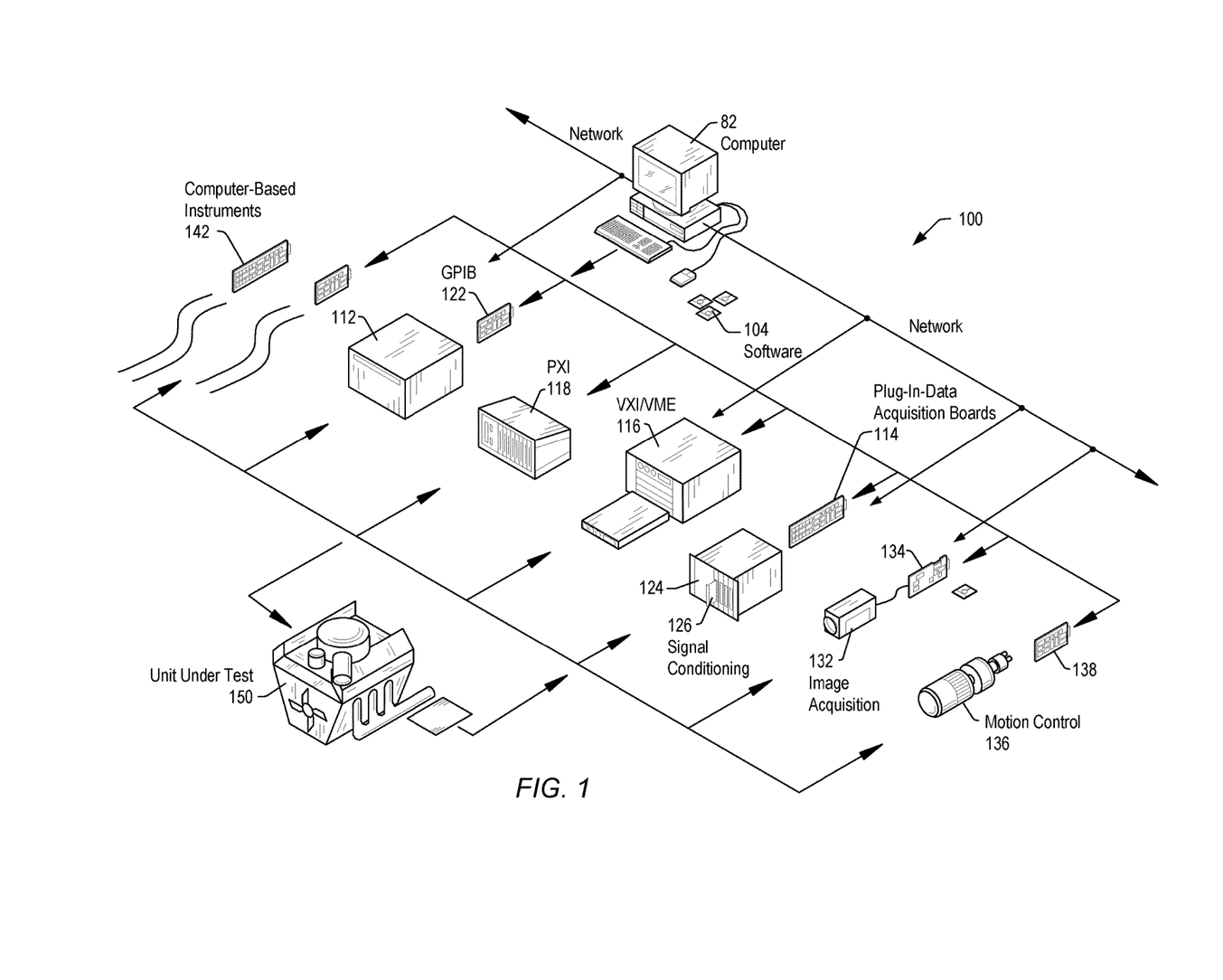
FIG. 1 shows an instrumentation control system with instruments networked together according to one set of embodiments.

FIG. 1 illustrates an exemplary instrumentation control system 100 which may be configured according to various embodiments of the system(s) and/or method(s) of auto-zeroing disclosed herein. System 100 comprises a host computer 82 which may couple to one or more instruments configured to perform a variety of functions, including auto-zeroing function(s) according to various embodiments of the system(s) and method(s) of auto-zeroing disclosed herein. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
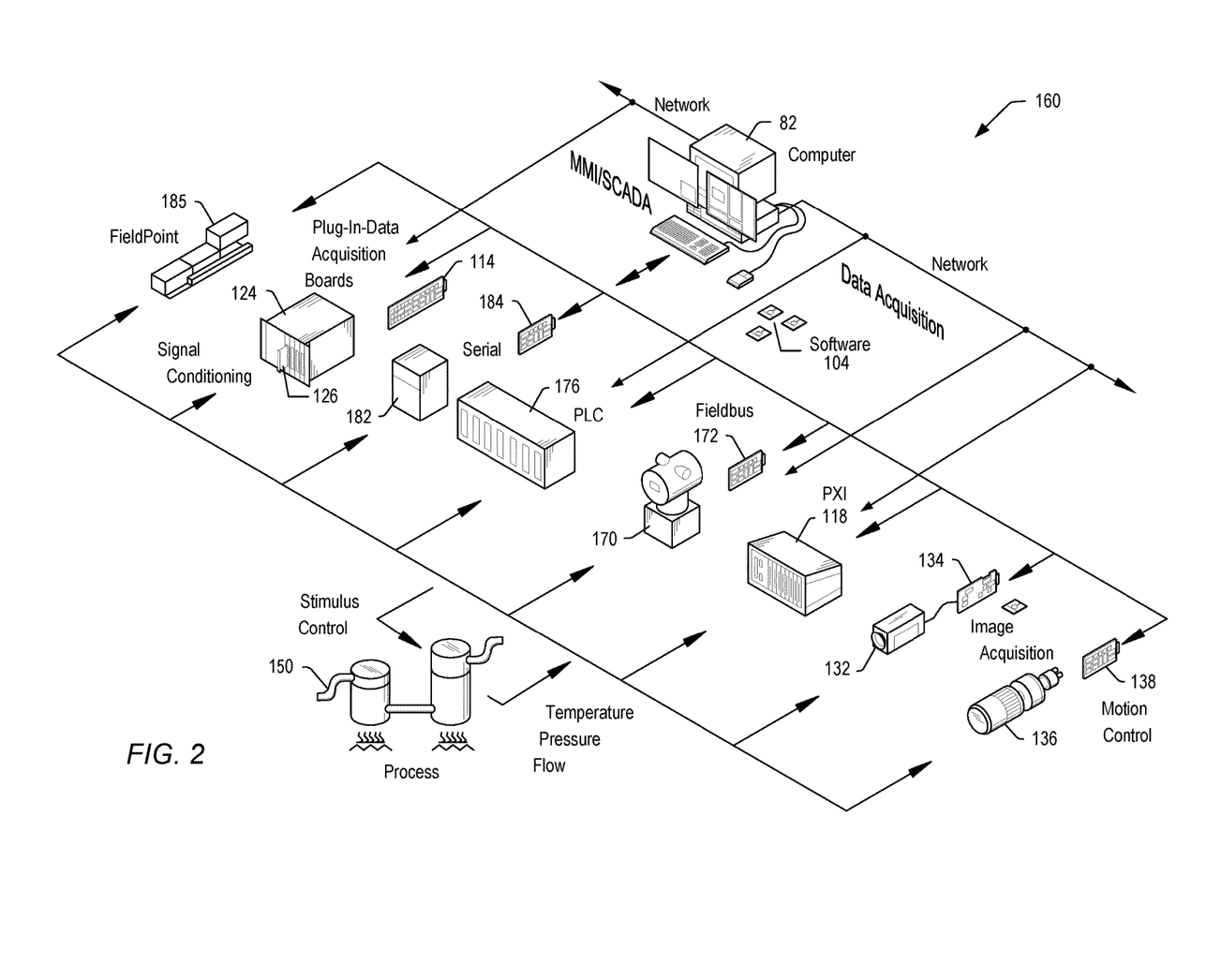
FIG. 2 shows an industrial automation system with instruments networked together according to one set of embodiments.

FIG. 2 illustrates an exemplary industrial automation system 160 that may be configured according to various embodiments of the system(s) and/or method(s) of auto-zeroing disclosed herein. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to perform a variety of functions, including auto-zeroing function(s) according to various embodiments of the system(s) and method(s) of auto-zeroing disclosed herein. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices.

In one set of embodiments, any one or more of the instruments and/or the various connectivity interfaces of computer 82 (coupling computer 82 to the one or more devices) may be implemented to perform auto-zeroing as will be further described in detail below. Generally, various embodiments disclosed herein facilitate an instrument, for example an instrument configured in an automated test system, to perform auto-zeroing procedure(s) such that measurement time and measurement noise are reduced for "auto zeroing once" (AZO) procedures, while also reducing measurement noise for "auto-zeroing every sample" (AZES) procedures over a wide range of sample rates.

While various embodiments are described herein in greater detail with respect to specific embodiments of a data acquisition (DAQ) system, the auto-zeroing technique(s) and system(s) described herein may equally be used with and/or extended to many other instruments such as a function generator or digital test equipment, and/or any other system(s) where auto-zeroing is employed or may be employed.

Figure 3:
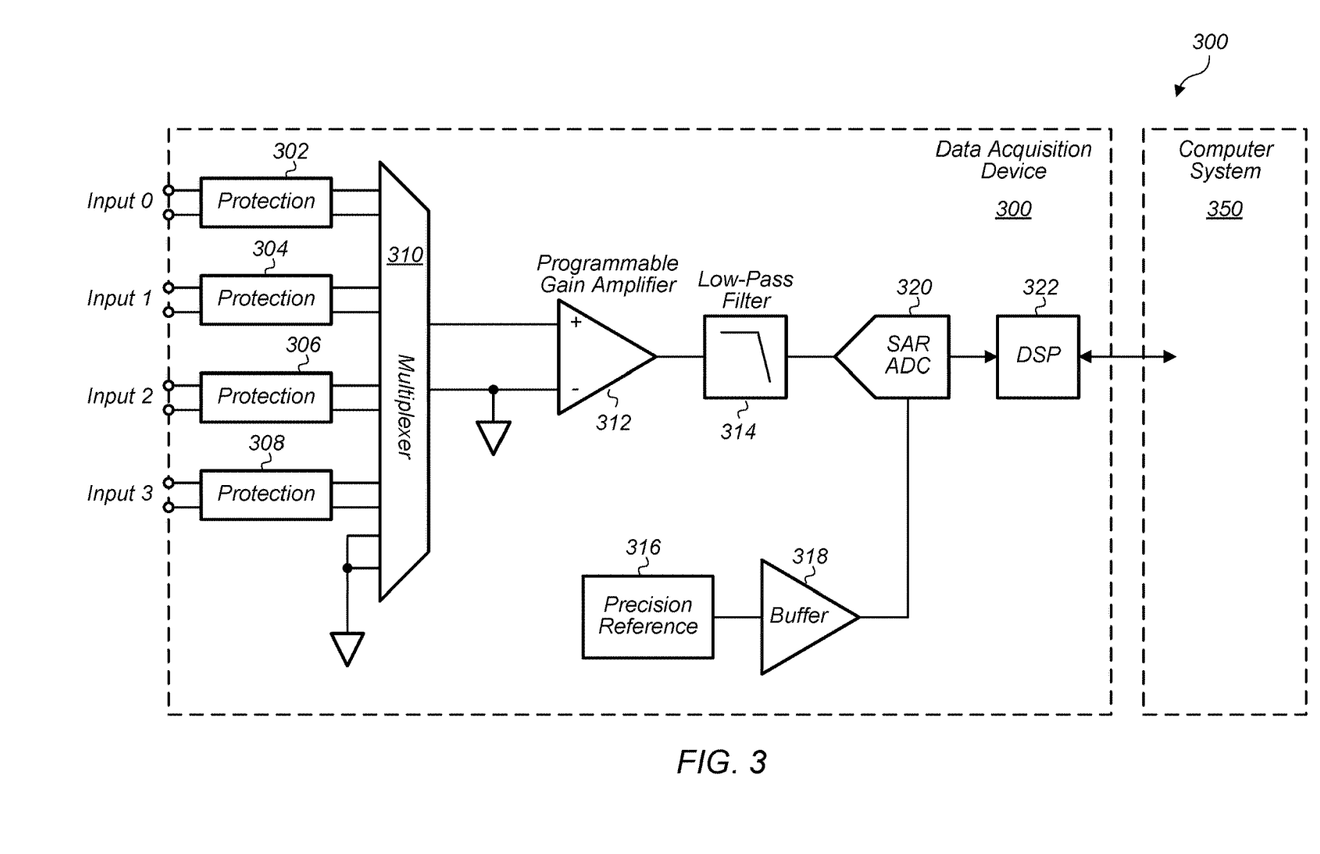
FIG. 3 shows a simplified circuit diagram of a data acquisition system, according to some embodiments.

FIG. 3 shows a simplified circuit diagram of a DAQ system 300, according to some embodiments. The DAQ system shown in FIG. 3 includes a DAQ device 300 coupled to a computer system 350. DAQ device 300 includes four individual inputs (or input terminals), which may be inputs for receiving analog input signals. Each input signal may be relayed to multiplexer 310 through respective protection circuitry (302, 304, 306, and 308, respectively). The multiplexed signal is then amplified through amplifier 312, which may be a programmable gain amplifier. The amplified signal is filtered by low-pass filter (LPF) 341, then digitized by analog-to-digital converter (ADC) 320. In the embodiment shown in FIG. 3, ADC 320 is a successive approximation register (SAR) ADC. ADC 320 may be operated using a reference voltage generated by precision reference circuitry 316, provided to ADC 320 via buffer 318. The digitized (or digital) signal is then provided to digital signal processing (DSP) unit 322, which may provide the digital signal equivalents of the received analog signals, or the digital signals respectively corresponding to the analog signals respectively received at Input 0, Input 1, Input 2, and Input 3, to the computer system 350 for further processing and/or use. In some embodiments, DSP 322 may include functions for performing auto-zeroing operations as will be further described below.

Considering the DAQ system 300 shown in FIG. 3, an auto-zeroing algorithm may be executed/implemented to correct for any offset errors that may be present in the analog input signal path, and to improve low-frequency noise measurement performance. The analog input signal path may be identified as the path of the analog input signal(s)

from the input terminal (Input 0, Input 1, Input 2, and Input 3) through multiplexer 310, amplifier 312, and LPF 314 into ADC 320. A conventional, or prior-art auto-zero algorithm involves measuring the offset of a signal conditioning path via an internal input short (zero volts standard) and using this measurement to correct for the offset error during subsequent input measurements. Auto-zeroing, and the use of the obtained/determined offset value during subsequent measurements may be summarized by the following equations ($V_{AI0}$ represents the value of the regular measured signal, and $V_{S1}$ represents the actual value—without error—of the regular measured signal).

$$V_{Short} = V_{OffsetError}$$ 1. Offset Measurement:

$$V_{AI0} = V_{S1} + V_{OffsetError}$$ 2. Input measurement:

$$V_{OffestCorrectedInput} = V_{AI0} - V_{Short}$$

$$V_{OffestCorrectedInput} = (V_{S1} + V_{OffsetError}) - V_{OffsetError} = V_{S1}$$ 3. Offset-corrected input measurement:

An auto-zeroing measurement may be performed in at least two different ways. "Auto-zero once" (AZO) is performed to measure the offset at the beginning of data/signal acquisition, while "auto-zero every sample" (AZES) is performed to measure the offset at the beginning of every data/signal acquisition sample period. AZO is an effective offset cancellation technique when the ambient temperature is stable throughout an acquisition. AZO has no impact on low-frequency noise measurement performance. AZES is an effective offset cancellation technique in the presence of ambient temperature fluctuations. AZES improves low-frequency noise measurement performance. Averaging decimation filters may be used to improve measurement resolution, as shown in the following equation:

$$\bar{x} = \frac{1}{n} \cdot \sum_{i=1}^{n} x_i = \frac{1}{n}(x_1 + \ldots + x_n).$$

For a white noise signal, the averaged signal noise decreases with the square root of the number of averaged samples, as shown in the following equation:

$$\text{Noise} = \frac{\text{noise}}{\sqrt{\text{samples}}}.$$

Figure 4A:
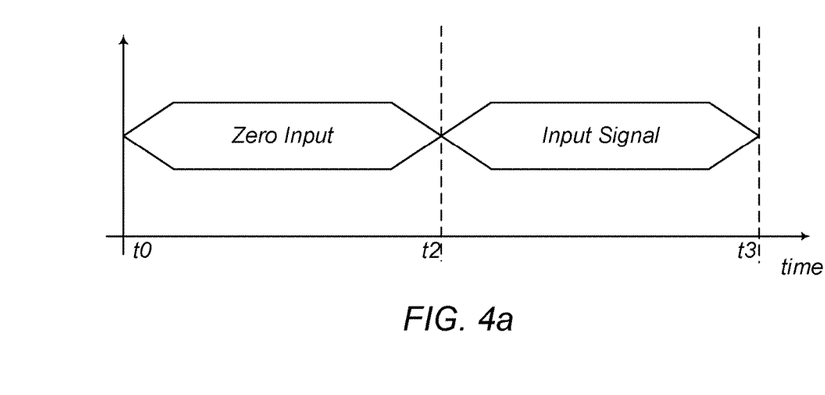
FIG. 4a shows a timing diagram illustrating a sampling period which is evenly divided between zero input sampling and input signal sampling.

As discussed above, AZES improves low-frequency noise performance. The time spent measuring zero input, that is, the time spent measuring a zero input voltage to obtain the offset value is taken away from time that would otherwise be used for measuring the input signal. Obtaining fewer input (signal) samples leads to higher input averaged signal noise. For equal input and zero measurement samples, the zero measurement has as much noise as the input measurement. To put it another way, if the sampling period during which an input signal is sampled is cut in half, the first half of that period used to sample the zero input, then the measurement of the zero input (signal) is prone to as much noise as the measurement of the input signal. FIG. 4a shows a timing diagram illustrating a sampling period spanning from t0 to t3, with the first half of the sampling period spanning from t0 to t2 used for sampling the zero input, and the second half of the sampling period spanning from t2 to t3 used for sampling the input signal.

Overall, AZES may incur a noise penalty, typically on the order of +6 dB. For low sample frequency measurements, i.e. for low-frequency sampling, the benefits of removing low-frequency noise outweigh the noise penalty of AZES. This, however, is not the case for sampling frequencies well above the flicker noise corner frequency. Low-frequency noise removed by AZES is therefore band limited. However, according to various embodiments described herein, the zero measurement noise, i.e. the noise incurred during measurement/sampling of the zero input (signal), may be reduced without altering the low-frequency noise and without affecting the zero input sampling/measurement. Accordingly, in some embodiments, the ratio of zero input sampling time to input signal sampling time may be varied/adjusted based on the sample/sampling rate. This means that unlike the 50/50 ratio with respect to the sampling period, the time period during which the zero input is sampled may be less than 50% of the entire sampling/sample period. This is illustrated in FIG. 4b.

Figure 4B:
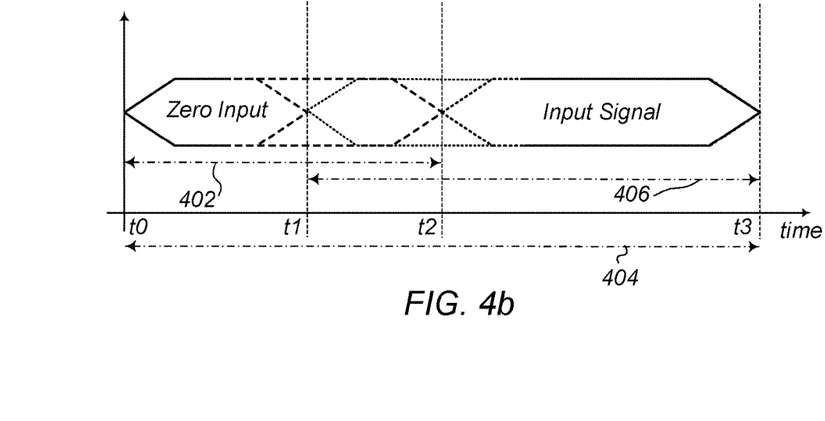
FIG. 4b shows a timing diagram illustrating a sampling period in which the ratio of zero input sampling time to input signal sampling time is varied based on sample/sampling rate, according to some embodiments.

As shown in FIG. 4b, the ratio of zero input sampling time to input signal sampling time may be varied/adjusted in contrast to what is illustrated in FIG. 4a. Time span/period 404 may extend from t0 to t3, representing a sampling period. The time period during which the zero input is sampled may span anywhere from between t0 and t1 to between t0 and t2. Correspondingly, the time period during which the input signal is sampled may span anywhere from between t1 and t3 to between t2 and t3, respectively. A maximum time period during which the zero input is sampled is represented by time span/period 402, corresponding to a minimum time period during which the input signal is sampled. Similarly, a maximum time period during which the input signal is sampled is represented by time span/period 406, corresponding to a minimum time period during which the zero input is sampled. The maximum value for time span 402 is shown as the time span/period between t0 and t2, but in various embodiments time span 402, and correspondingly time span 406 may be different than what is illustrated in FIG. 4b. Nevertheless, the time period during which the zero input is sampled may be varied based on the sample/sampling rate, thereby changing the ratio of the zero input sampling time (period) to the input signal sampling time (period).

Figure 5:
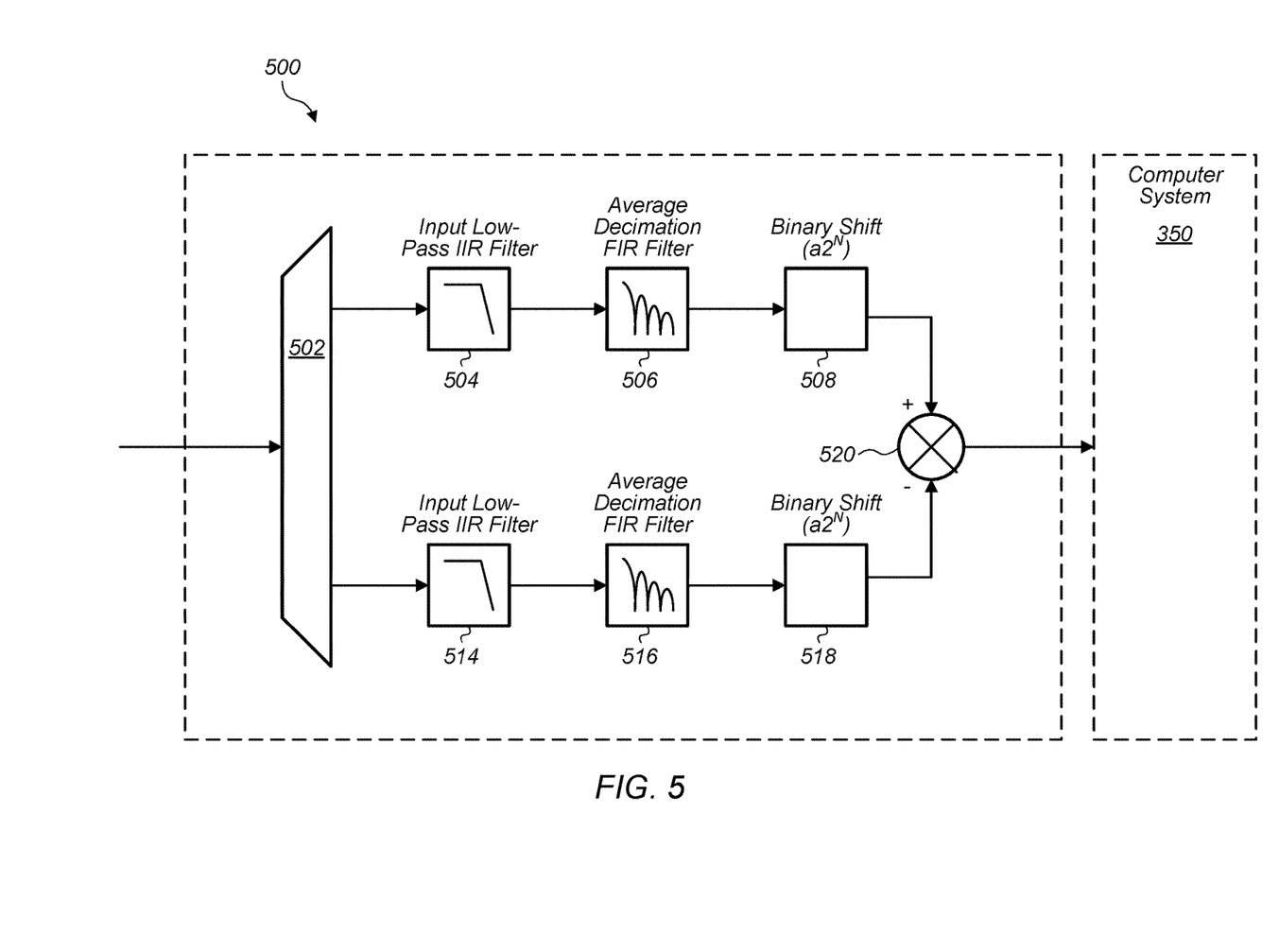
FIG. 5 shows a simplified block diagram of a digital signal processing unit that can perform auto-zeroing, according to some embodiments.

FIG. 5 shows a simplified block diagram of a digital signal processing (DSP) unit 500 that may be used when performing auto zeroing at least according to the timing illustrated in FIG. 4b. The use of a low-pass IIR (infinite impulse response) filter (504, 514) for the zero input measurement allows reducing the measurement noise during the zero input measurement(s), without altering the low-frequency noise and without affecting the zero input measurement. Use of a low-pass IIR filter (504, 514) reduces the number of zero-samples required for the zero input measurement, increasing the number of samples available to measure the input signal, effectively increasing the input measurement resolution. In other words, referring again to FIG. 4b, by reducing the zero input measurement time period, the input signal measurement time period is automatically increased, as more input signal samples may be gathered during the additional time of the sampling time period 404 made available by the reduction of the zero input measurement time period.

As shown in FIG. 5, DSP 500 includes a digital signal multiplexer 502 and independent digital signal processing paths for the input signal measurements and the zero input measurements, respectively. For example, the upper path in DSP 500 (including components 504, 506, and 508) may be used for processing the input signal measurements, while the lower path (including components 514, 516, and 518) may be used for processing the zero input measurements. Each digital signal path includes a programmable cutoff low-pass IIR filter (504 and 514, respectively), an average decimation FIR (finite impulse response) filter (506 and 516, respectively), and a binary shift scaler (508 and 518, respectively). The binary shift scaler makes it possible to obtain a power-of-two ratio of input signal samples to zero input samples, e.g., one (1) zero input sample for every two (2), four (4), eight (8), etc., input signal samples. Referring again to FIG. 4b, this ratio would be applicable to the ratio of the zero input sampling time to the input signal sampling time. The ratio of input signal samples to zero input samples and/or input signal sampling time (period) to zero input sampling time (period) is also referred to herein as "input-to-zero" ratio. Thus, the upper path may be used to obtain an input signal value representative of the input signal and the lower path may be used to obtain an offset value representative of the zero input, and the offset value may then be subtracted from the input signal value at mixer 520 to obtain an adjusted (corrected) input signal value.

Figure 6:
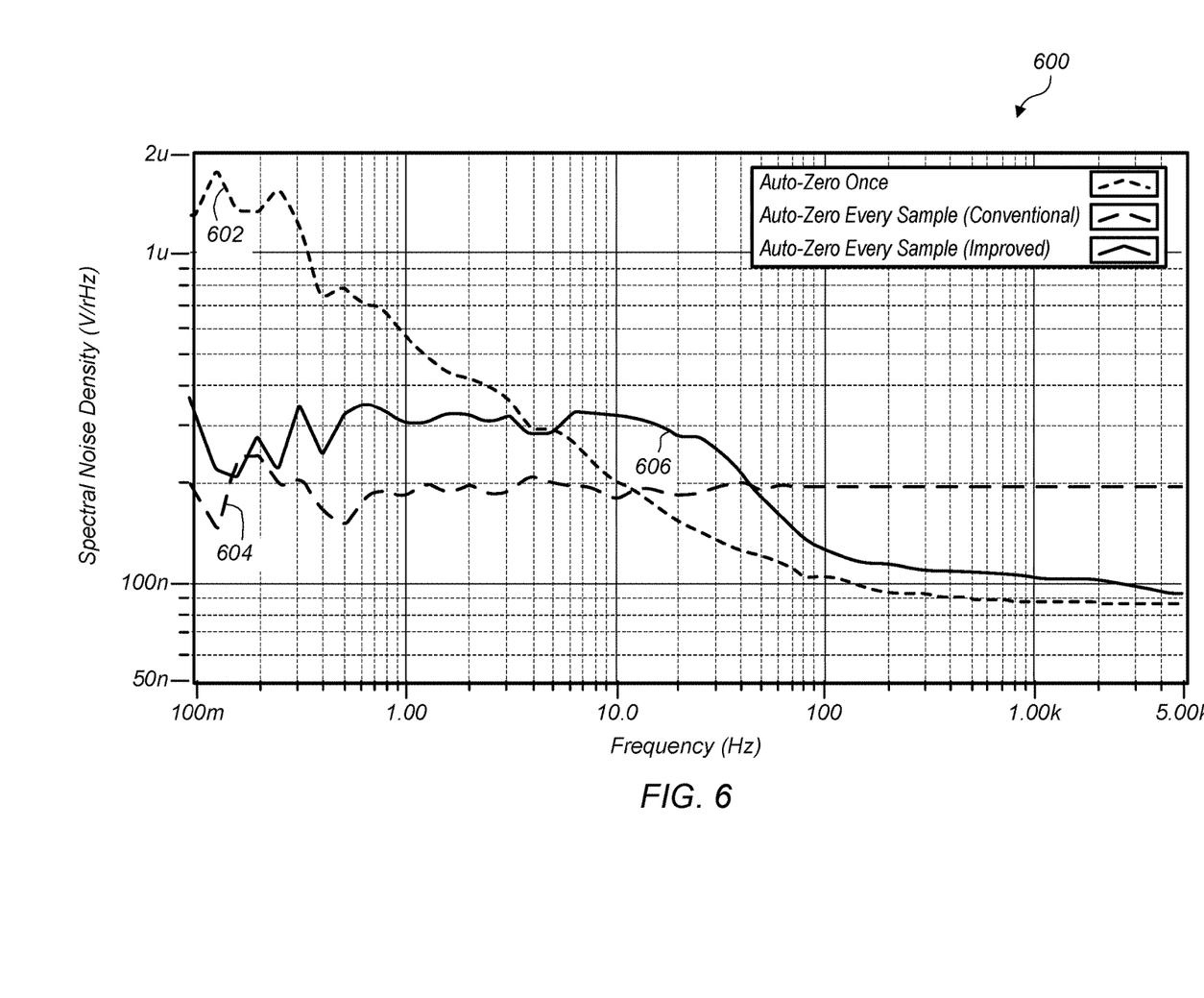
FIG. 6 shows a diagram illustrating noise density at various frequencies for a data acquisition sampling rate of 10 kS/s (kilo-samples per second), according to some embodiments.
Figure 7:
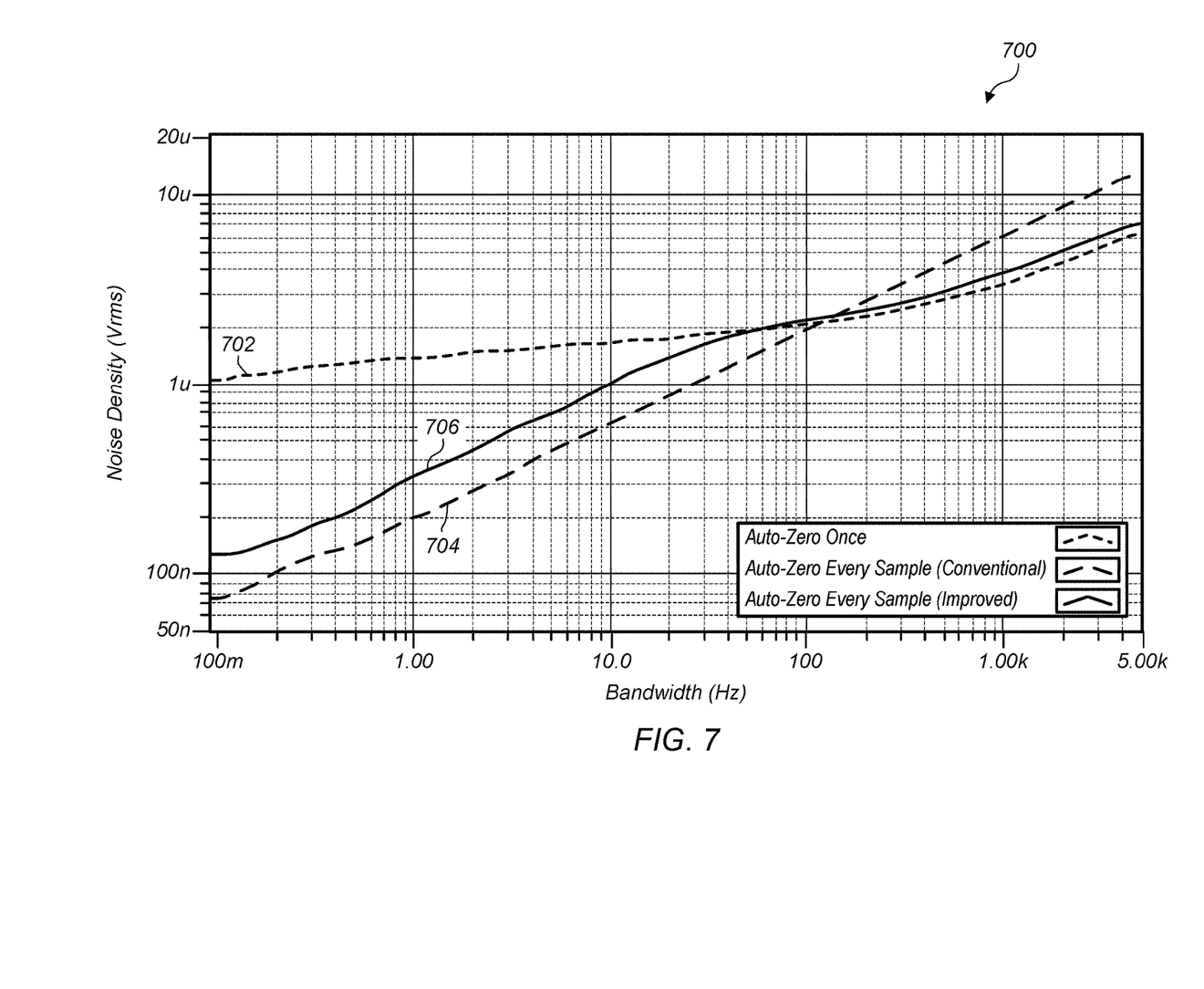
FIG. 7 shows a diagram illustrating integrated noise values at various frequencies for a data acquisition sampling rate of 10 kS/s, according to some embodiments.

For sampling frequencies above a specified frequency associated with (or characteristic of) the signal conditioning path (the path of the input signal, e.g. in reference to FIG. 3), in this case the flicker noise corner frequency of the signal conditioning path, noise performance may be optimized with a high input-to-zero ratio, i.e. with the number of input signal samples exceeding the number of zero input samples. FIGS. 6 and 7 show the noise density and integrated noise comparison for a sample rate of 10 kS/s (kilo-samples per second) when performing AZO, AZES using a prior-art (conventional algorithm), and improved AZES according to FIG. 4b, using digital signal processing, as implemented by DSP unit 500 shown in FIG. 5, for example. More specifically, FIG. 6 shows a diagram illustrating noise density at various frequencies for a data acquisition sampling rate of 10 kS/s (kilo-samples per second), when performing AZO (602), AZES-prior-art (604), and AZES-improved (606), and FIG. 7 shows a diagram illustrating integrated noise values at various frequencies for a data acquisition sampling rate of 10 kS/s, when performing AZO (702), AZES-prior-art (704), and AZES-improved (706).

Figure 8:
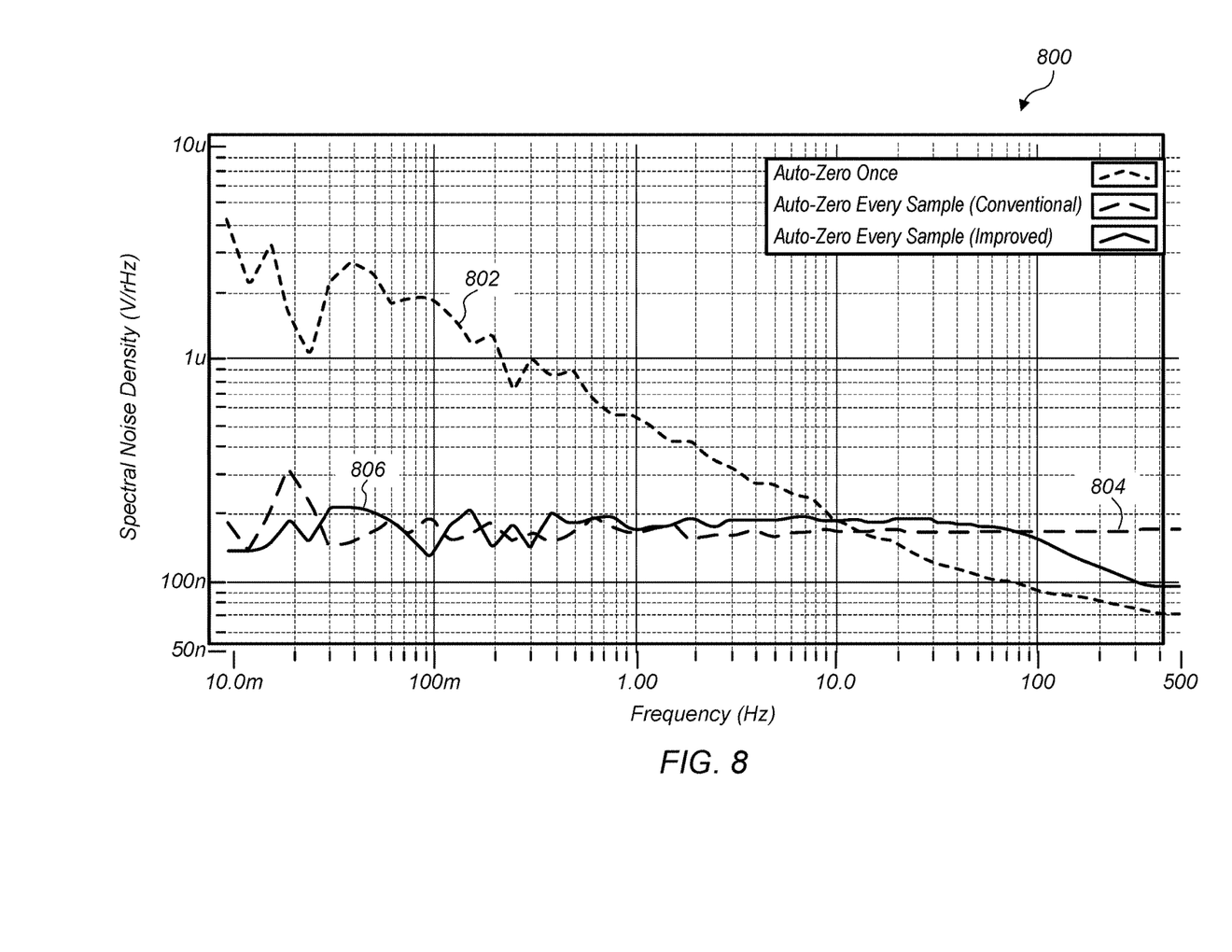
FIG. 8 shows a diagram illustrating noise density at various frequencies for a data acquisition sampling rate of 1 kS/s, according to some embodiments.
Figure 9:
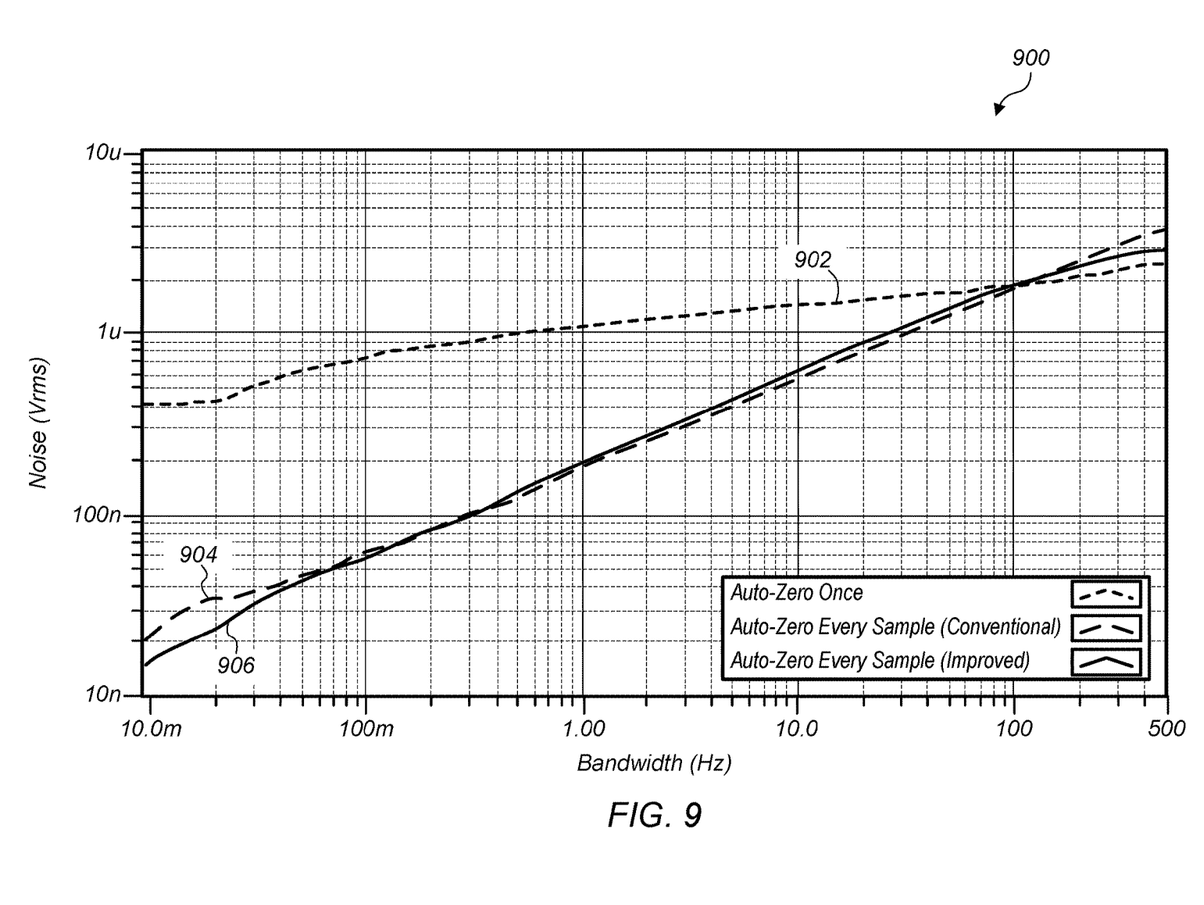
FIG. 9 shows a diagram illustrating integrated noise values at various frequencies for a data acquisition sampling rate of 1 kS/s, according to some embodiments.

For sampling frequencies equal to or lower than the specified frequency associated with (or characteristic of) the signal conditioning path, again, in this case the flicker noise corner frequency of the signal conditioning path, noise performance may be optimized with a unity input-to-zero ratio, i.e. with the number of input signal samples matching the number of zero input samples. FIGS. 8 and 9 show the noise density and integrated noise comparison for a sample rate of 1 kS/s (kilo-samples per second) when performing AZO, AZES using a prior-art (conventional algorithm), and improved AZES according to FIG. 4b, using digital signal processing, as implemented by DSP unit 500 shown in FIG. 5, for example. More specifically, FIG. 8 shows a diagram illustrating noise density at various frequencies for a data acquisition sampling rate of 1 kS/s (kilo-samples per second), when performing AZO (802), AZES-prior-art (804), and AZES-improved (806), and FIG. 9 shows a diagram illustrating integrated noise values at various frequencies for a data acquisition sampling rate of 1 kS/s, when performing AZO (902), AZES-prior-art (904), and AZES-improved (906).

The auto-zeroing algorithm may change the input-to-zero ratio based on the sample frequency to improve noise performance. For example, for higher sampling frequencies, e.g. above a specified frequency threshold, the input-to-zero ratio may be increased to be above unity. In some embodiments, the ratio may reflect a power-of-two to one value, e.g. 2-to-1, 4-to-1, 8-to-1, etc. For sampling frequencies at or below the specified frequency threshold, the input-to-zero ratio maybe set at unity.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A data acquisition (DAQ) system comprising:
 an input terminal configured to receive a signal;
 a first circuit configured to sample the signal according to a specified sampling rate that defines a sampling time interval, wherein during each sampling time interval:
  the signal is a reference signal during a first time period of the sampling time interval for obtaining first samples representative of the reference signal; and
  the signal is an input signal during a second time period of the sampling time interval for obtaining second samples representative of the input signal;
 wherein a ratio of the second time period to the first time period is determined based on the sampling rate; and
 a second circuit configured to:
  process the first samples to obtain an offset value;
  process the second samples to obtain an input signal value; and
  adjust the input signal value based on the offset value.

2. The DAQ system of claim 1, wherein the second circuit comprises:
 a first digital signal processing path for processing the first samples; and
 a second digital signal processing path distinct from the first digital signal processing path for processing the second samples.

3. The DAQ system of claim 2, wherein at least one of the first digital signal processing path and the second digital signal processing path comprises:
 a low-pass filter configured to receive and filter samples;
 an average decimation filter configured to average the filtered samples to produce an average sample value; and
 a binary shifter configured to adjust the average sample value.

4. The DAQ system of claim 3, wherein the binary shifter is configured to adjust the average sample value according to the ratio of the second time period to the first time period.

5. The DAQ system of claim 1, wherein the ratio of the second time period to the first time period is one of:
 one, when the sampling frequency is equal to or lower than a specified frequency associated with at least a portion of the first circuit; or
 a power-of-two greater than one, when the sampling frequency is greater than the specified frequency associated with the at least a portion of the first circuit.

6. The DAQ system of claim 5, wherein the at least a portion of the first circuit is a signal conditioning path for the signal.

7. The DAQ system of claim 6, wherein the specified frequency is a flicker noise frequency of the signal conditioning path.

8. The DAQ system of claim 1, wherein the first circuit comprises a successive approximation register digital-to-analog converter configured to generate the first samples and the second samples based on the signal.

9. The DAQ system of claim 1, wherein the reference signal is a zero signal.

10. A method for sampling a signal according to a sampling rate that defines a sampling time interval, the method comprising:
during a first time period of each sampling time interval:
receiving, at an input terminal of a data acquisition device, a reference signal; and
sampling, by the data acquisition device, the reference signal according to the sampling rate to obtain first samples representative of the reference signal;
during a second time period of each sampling time interval:
receiving, at the input terminal of the data acquisition device, an input signal; and
sampling, by the data acquisition device, the input signal according to the sampling rate to obtain second samples representative of the input signal;
processing, by the data acquisition device, the first samples to obtain an offset value;
processing, by the data acquisition device, the second samples to obtain an input signal value; and
adjusting, by the data acquisition device, the input signal value based on the offset value;
wherein a ratio of the second time period to the first time period is determined based on the sampling rate.

11. The method of claim 10;
wherein said processing the first samples comprises processing the first samples via a first digital signal processing path of the data acquisition device; and
wherein said processing the second samples comprises processing the second samples via a second digital signal processing path of the data acquisition device distinct from the first digital signal processing path.

12. The method of claim 11, wherein said processing the first samples and said processing the second samples comprises:
low-pass filtering the first samples and the second samples;
averaging the low-pass filtered first samples to obtain a first average sample value and averaging the low-pass filtered second samples to obtain a second average sample value; and
adjusting the first average sample value and the second average sample value.

13. The method of claim 12, wherein said adjusting the first average sample value and the second average sample value comprises adjusting the first average sample value and the second average sample value according to the ratio of the second time period to the first time period.

14. The method of claim 11, further comprising:
conditioning the reference signal and the input signal via a signal conditioning path;
wherein the ratio of the second time period to the first time period is one of:
one, when the sampling frequency is equal to or lower than a specified frequency characteristic of the signal conditioning path; or
a power-of-two greater than one, when the sampling frequency is greater than the specified frequency characteristic of the signal conditioning path.

15. A system comprising:
a sampling circuit configured to:
obtain first samples representative of a reference signal by sampling the reference signal according to a sampling rate during a first time period of each sampling time interval defined by the sampling rate;
obtain second samples representative of an input signal by sampling the input signal according to the sampling rate during a second time period of each sampling time interval defined by the sampling rate, wherein a ratio of the second time period to the first time period is determined based on the sampling rate; and
a digital signal processing circuit configured to:
process the first samples to obtain an offset value;
process the second samples to obtain an input signal value; and
adjust the input signal value based on the offset value.

16. The system of claim 15, wherein the digital signal processing circuit comprises:
a first digital signal processing path for processing the first samples; and
a second digital signal processing path distinct from the first digital signal processing path for processing the second samples.

17. The system of claim 16, wherein the first digital signal processing path and the second digital signal processing path each comprise:
a low pass filter configured to receive and filter samples;
an average decimation filter configured to average the filtered samples to produce an average sample value; and
a binary shifter configured to adjust the average sample value according to the ratio of the second time period to the first time period.

18. The system of claim 15, further comprising:
a signal conditioning path configured to condition the reference signal and the input signal prior to the reference signal and the input signal being sampled;
wherein the ratio of the second time period to the first time period is one of:
one, when the sampling frequency is equal to or lower than a specified frequency characteristic of the signal conditioning path; or
a power-of-two greater than one, when the sampling frequency is greater than the specified frequency characteristic of the signal conditioning path.

19. The system of claim 18, wherein the specified frequency is a flicker noise frequency of the signal conditioning path.

20. The system of claim 15, wherein the reference signal is a zero signal.

* * * * *